United States Patent
Yang et al.

(10) Patent No.: US 9,349,689 B2
(45) Date of Patent: May 24, 2016

(54) SEMICONDUCTOR DEVICES INCLUDING CONDUCTIVE FEATURES WITH CAPPING LAYERS AND METHODS OF FORMING THE SAME

(75) Inventors: Hui-Chun Yang, Hsin-Chu (TW);
Mei-Ling Chen, Hsin-Chu (TW);
Keng-Chu Lin, Ping-Tung (TW);
Joung-Wei Liou, Zhudong (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 302 days.

(21) Appl. No.: 13/452,446

(22) Filed: Apr. 20, 2012

(65) Prior Publication Data
US 2013/0277853 A1    Oct. 24, 2013

(51) Int. Cl.
| H01L 21/4763 | (2006.01) |
| H01L 23/532 | (2006.01) |
| H01L 21/285 | (2006.01) |
| H01L 21/768 | (2006.01) |

(52) U.S. Cl.
CPC .... *H01L 23/53238* (2013.01); *H01L 21/28562* (2013.01); *H01L 21/7684* (2013.01); *H01L 21/76807* (2013.01); *H01L 21/76826* (2013.01); *H01L 21/76829* (2013.01); *H01L 21/76832* (2013.01); *H01L 21/76849* (2013.01); *H01L 23/5329* (2013.01); *H01L 23/53295* (2013.01); *H01L 2924/0002* (2013.01)

(58) Field of Classification Search
CPC ............. H01L 21/4763; H01L 21/76849; H01L 21/76829; H01L 21/76834; H01L 23/53295
USPC .............................. 438/626, 627
See application file for complete search history.

(56) References Cited

U.S. PATENT DOCUMENTS

| 5,683,924 | A  | * | 11/1997 | Chan et al. | .................... 438/300 |
| 5,811,865 | A  | * | 9/1998 | Hodges et al. | .................. 257/411 |
| 6,153,935 | A  | * | 11/2000 | Edelstein et al. | .............. 257/773 |
| 6,177,344 | B1 | * | 1/2001 | Xia et al. | ........................ 438/646 |
| 6,287,927 | B1 | * | 9/2001 | Burke et al. | ................... 438/308 |
| 6,451,712 | B1 | | 9/2002 | Dalton et al. | |
| 6,611,060 | B1 | * | 8/2003 | Yano et al. | ...................... 257/758 |
| 7,282,438 | B1 | * | 10/2007 | Yu et al. | ......................... 438/627 |
| 2005/0233572 | A1 | * | 10/2005 | Su et al. | ......................... 438/618 |
| 2006/0261387 | A1 | * | 11/2006 | Izumi | .............................. 257/295 |
| 2011/0001250 | A1 | * | 1/2011 | Lin et al. | ........................ 257/778 |
| 2011/0306214 | A1 | | 12/2011 | Zin | |
| 2012/0214318 | A1 | * | 8/2012 | Fukazawa et al. | ............. 438/786 |

FOREIGN PATENT DOCUMENTS

| KR | 101081853 | 11/2011 |
| WO | WO 2006/113186 | 10/2006 |

OTHER PUBLICATIONS

Galusek et al. "In-Situ Carbon Content Adjustment in Polysilazane Derived Amorphous SiCN Bulk Ceramics". Journal of European Ceramic Society. 1999.*

* cited by examiner

*Primary Examiner* — Phuc Dang
(74) *Attorney, Agent, or Firm* — Slater Matsil, LLP (57) ABSTRACT

Semiconductor devices, methods of manufacture thereof, and methods of forming conductive features thereof are disclosed. A semiconductor device includes an insulating material layer disposed over a workpiece. The insulating material layer includes a silicon-containing material comprising about 13% or greater of carbon (C). A conductive feature is disposed within the insulating material layer. The conductive feature includes a capping layer disposed on a top surface thereof.

19 Claims, 11 Drawing Sheets

SEMICONDUCTOR DEVICES INCLUDING CONDUCTIVE FEATURES WITH CAPPING LAYERS AND METHODS OF FORMING THE SAME

BACKGROUND

Semiconductor devices are used in a variety of electronic applications, such as personal computers, cell phones, digital cameras, and other electronic equipment, as examples. Semiconductor devices are typically manufactured by providing a workpiece, forming various material layers over the workpiece, and patterning the various layers using lithography to form integrated circuits. The semiconductor industry continues to improve the integration density of various electronic components of integrated circuits, i.e., transistors, diodes, resistors, capacitors, etc., by continual reductions in minimum feature size, which allow more components to be integrated into a given area.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance. Copper is now often used as a conductive material for interconnects in some applications. Low dielectric constant (k) materials and extra-low k materials have begun to be implemented in some designs.

What are needed in the art are improved fabrication techniques for conductive features of semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to manufacturing methods for semiconductors and semiconductor device structures. Novel methods of forming conductive features of semiconductor devices and structures thereof will be described herein, wherein a protective material is formed proximate conductive features to prevent contamination of a material layer proximate the conductive features from a subsequently formed capping layer, to be described further herein.

FIG. 1 through 8 illustrate cross-sectional views of a method of forming a conductive feature 130 (see FIG. 8) of a semiconductor device 100 in accordance with an embodiment of the present disclosure at various stages of manufacturing using a single damascene process. Note that only one conductive feature 130 is shown in the drawings herein; however, a plurality of conductive features 130 is formed across a surface of a semiconductor device 100 in accordance with embodiments herein.

Figure 1:
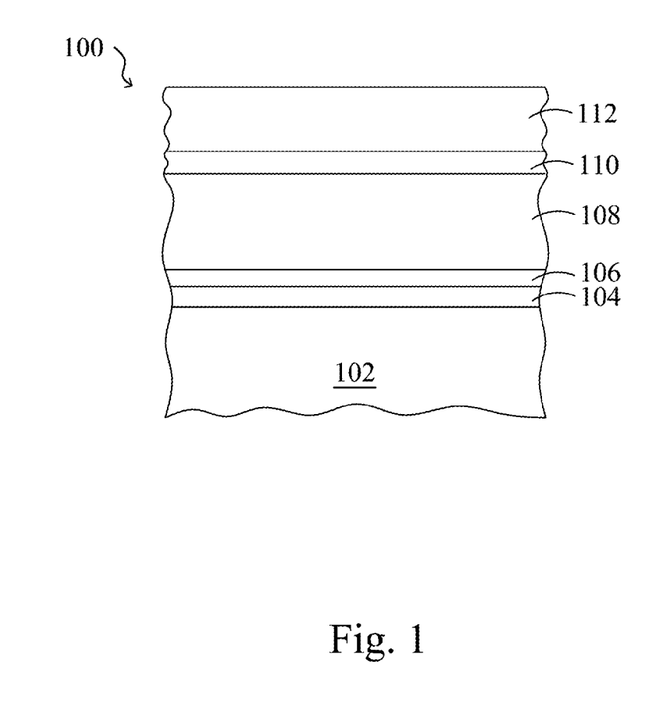
FIG. 1 through 8 illustrate cross-sectional views of a method of forming a conductive feature of a semiconductor device at various stages of manufacturing in accordance with an embodiment of the present disclosure using a single damascene process, wherein a protective cap layer is formed over a dielectric stack to protect an underlying material layer from contamination.

Referring first to FIG. 1, to form the conductive feature 130, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples. The workpiece 102 may comprise one or more layers of electrical circuitry and/or electronic functions formed thereon, and may include conductive lines, vias, capacitors, diodes, transistors, resistors, inductors, and/or other electrical components formed in a front end of the line (FEOL) process and/or a back end of the line (BEOL) process, for example (not shown).

An etch stop layer (ESL) 104 comprising an insulator is formed over the workpiece 102, as shown in FIG. 1. The ESL 104 may comprise about 8 to 30 nm of silicon nitride or SiCN formed by chemical vapor deposition (CVD) or physical vapor deposition (PVD), although alternatively, the ESL 104 may comprise other materials and dimensions and may be formed using other methods. The ESL 104 is also referred to herein as a first etch stop layer, for example.

A first insulating material layer 106 is formed over the ESL 104, also shown in FIG. 1. The first insulating material layer 106 comprises a layer comprising a thickness of about 5 to 30 nm of tetra-ethyl-ortho-silicate (TEOS) formed by CVD. The first insulating material layer 106 may alternatively comprise other dimensions and materials and may be formed using other methods. The TEOS 106 protects a subsequently formed second insulating material layer 108 from exposure to nitrogen in the ESL 104 in some embodiments, for example.

A second insulating material layer 108 is formed over the first insulating material layer 106, also shown in FIG. 1. The second insulating material layer 108 comprises a low dielectric constant (k) dielectric material having a k value of less than about a k value of silicon dioxide ($SiO_2$), which is about 3.9. In some embodiments, the second insulating material layer 108 comprises an extra low k dielectric material having a dielectric constant of less than about 2.7, as an example. The second insulating material layer 108 may comprise about 40 to 200 nm of SiCOH deposited by CVD, although alternatively, the second insulating material layer 108 may alternatively comprise other dimensions and materials and may be formed using other methods.

The first insulating material layer 106 comprises a material that is more structurally strong than the second insulating material layer 108 in some embodiments. The first insulating material layer 106 may have a higher k value than the second insulating material layer 108 for integration purposes, for example. The second insulating material layer 108 may be porous, yet provides a lower k value than the first insulating material layer 106, reducing the overall dielectric constant for the dielectric stack comprising layers 104, 106, 108, and 110, for example.

In accordance with an embodiment, a cap layer 110 is formed over the second insulating material layer 108, as shown in FIG. 1. The cap layer 110 is also referred to herein as a protective cap layer or an insulating material layer. The cap layer 110 is adapted to protect the underlying second insulating material layer 108 in this embodiment. The cap layer 110 comprises a silicon carbide (SiC)-rich material comprising about 13% or greater of carbon (C) in some embodiments. The cap layer 110 comprises SiC in some embodiments. The cap layer 110 may further comprise nitrogen (N); e.g., the cap layer 110 may comprise SiCN. A total carbon and nitrogen percentage of the protective cap layer 110 comprises at least about 50%, in some embodiments. The protective cap layer 110 may be deposited using CVD or PVD and may comprise a thickness of about 4 to 200 nm. The cap layer 110 may be formed by forming a SiC-rich material in an amine ($NH_3$) environment in some embodiments, to introduce N into the SiC-rich material, as an example. Alternatively, the cap layer 110 may comprise other dimensions and materials and may be formed using other methods.

The first insulating material layer 106 and the second insulating material layer 108 are also referred to collectively herein as a first insulating material layer 106/108, e.g., in some of the claims. The cap layer 110 is also referred to herein as a second insulating material layer 110, in these embodiments, wherein the second insulating material layer 110 comprises the silicon carbide (SiC)-rich material comprising about 13% or greater of carbon (C).

The cap layer 110, the second insulating material layer 108, the first insulating material 106, and optionally the ESL 104 or a portion thereof comprises a dielectric stack in which a conductive feature 130 (see FIG. 8) will be formed, in accordance with an embodiment of the present disclosure. The dielectric stack is patterned using lithography, and the patterned dielectric stack is filled with conductive material to form the conductive feature 130, to be described further herein.

Figure 2:
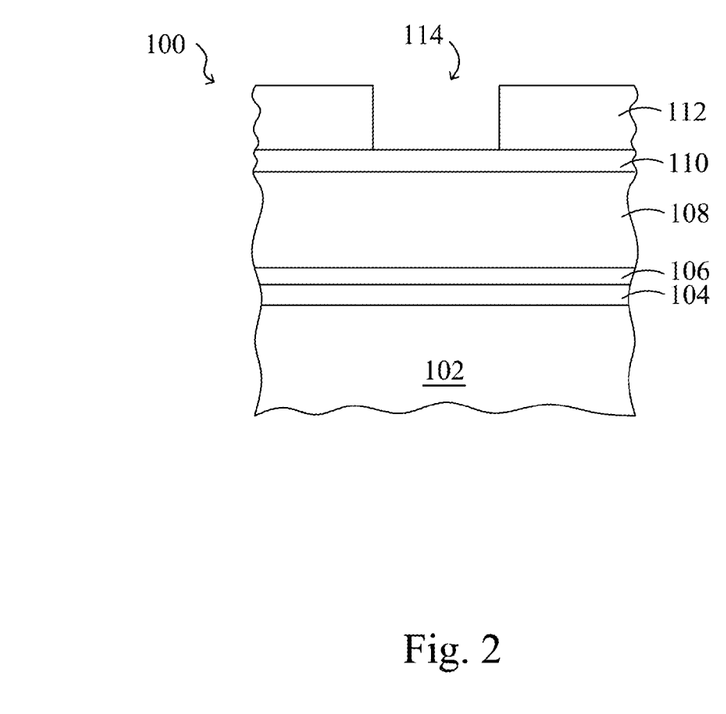
Figure 3:
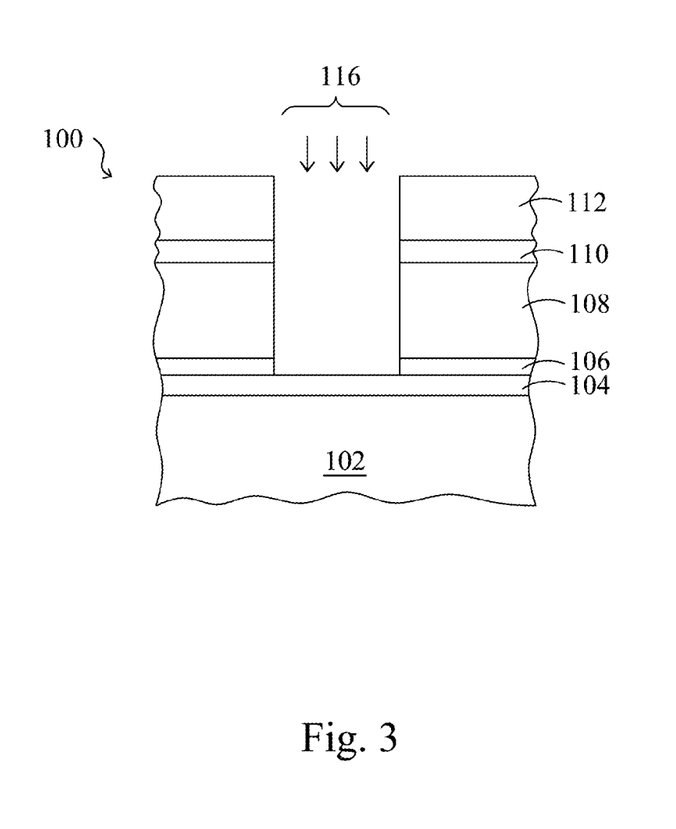
Figure 4:
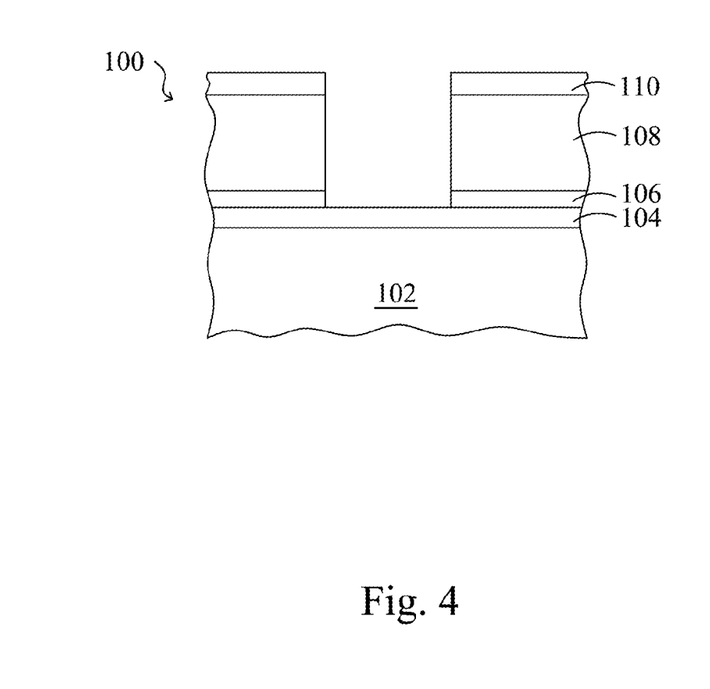

A layer of photoresist 112 is formed over the cap layer 110, as shown in FIG. 1. The layer of photoresist 112 is patterned using lithography, by exposing the layer of photoresist 112 to energy through or reflected from a lithography mask (not shown). Exposed (or unexposed, depending on whether the photoresist 112 is positive or negative) portions of the layer of photoresist 112 are then ashed and etched away, as shown in FIG. 2, forming patterns 114 for the conductive features in the layer of photoresist 112. The layer of photoresist 112 is then used as an etch mask during an etch process 116, as shown in FIG. 3, transferring the pattern 114 of the layer of photoresist 112 to the second insulating material layer 108 and the first insulating material layer 106. The etch process 116 may comprise a reactive ion etch (RIE) process or other type of etch process in which portions of the cap layer 110, second insulating material layer 108, first insulating material layer 106, and optionally also portions of or all of the etch stop layer 104 (not shown in FIG. 3: see the embodiment shown in FIG. 10) are etched away. The layer of photoresist 112 is then removed, as shown in FIG. 4.

Figure 5:
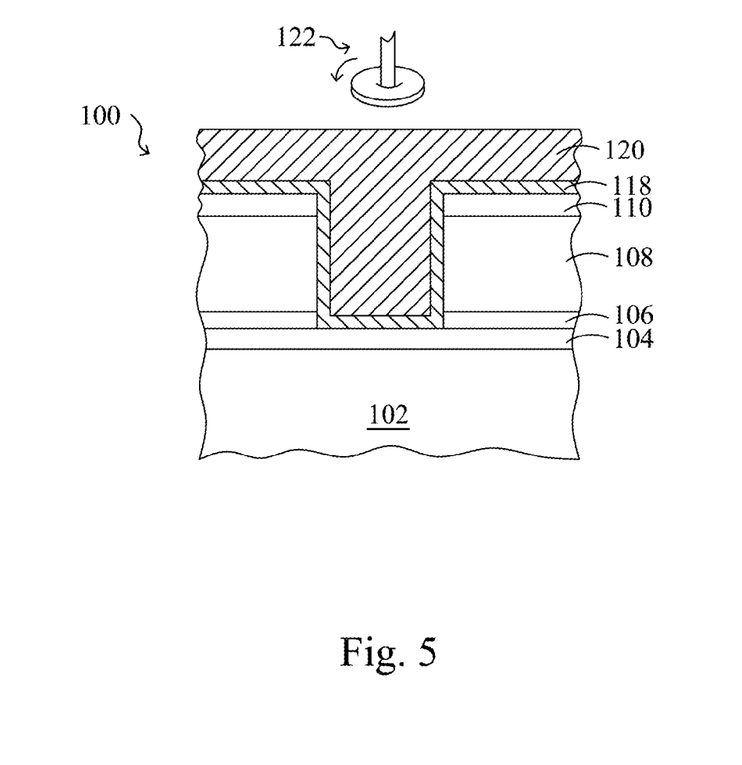

A liner 118 is formed over the patterned cap layer 110, the second insulating material layer 108, and the first insulating material layer 106, as shown in FIG. 5. The liner 118 may comprise about 1.0 to 4.5 nm of a conductive material, such as TiN, TaN, or combinations or multiple layers thereof, as examples, formed by PVD or sputtering. Alternatively, the liner 118 may comprise other dimensions and materials and may be formed using other methods. The liner 118 may function as a barrier layer for a subsequently-deposited conductive material 120 in some embodiments, for example.

Figure 6:
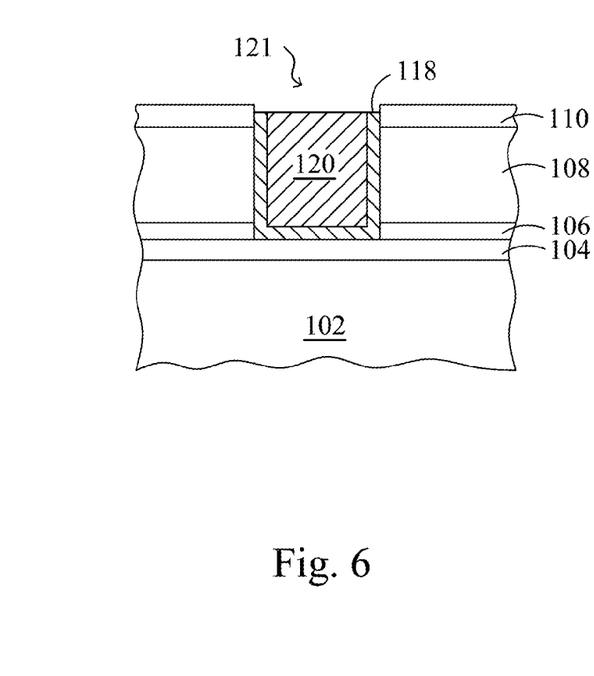

A conductive material 120 is formed over the liner 118, e.g., within the patterned cap layer 110 and insulating material layers 108 and 106, also shown in FIG. 5. The conductive material 120 comprises copper (Cu) or alloys thereof and may be formed by sputtering, electroplating, or electro-less plating, as examples, although alternatively, the conductive material 120 may comprise other materials and dimensions. The conductive material 120 fills the patterns in the cap layer 110 and the insulating material layers 108 and 106 and is also formed over a top surface of the liner 118 on the top surface of the patterned cap layer 110. A chemical-mechanical polish (CMP) process 122 is performed to remove the conductive material 120 and the liner 118 from over the top surface of the cap layer 110 and form a conductive feature 121, as shown in FIG. 6. The conductive feature 121 includes the conductive material 120 and the liner 118 left remaining in the patterned first insulating material layer 106, second insulating material layer 108, cap layer 110, and optionally also at least a portion of the ESL 104, at this stage of the manufacturing process.

Top surfaces of the liner 118 and the conductive material 120 may optionally be slightly recessed below a top surface of the cap layer 110 after the CMP process 122, also shown in FIG. 6. Alternatively, the top surface of the liner 118 and the conductive material 120 may be substantially coplanar with the top surface of the cap layer 110, as shown in the embodiment illustrated in FIG. 10, to be described further herein.

Figure 7:
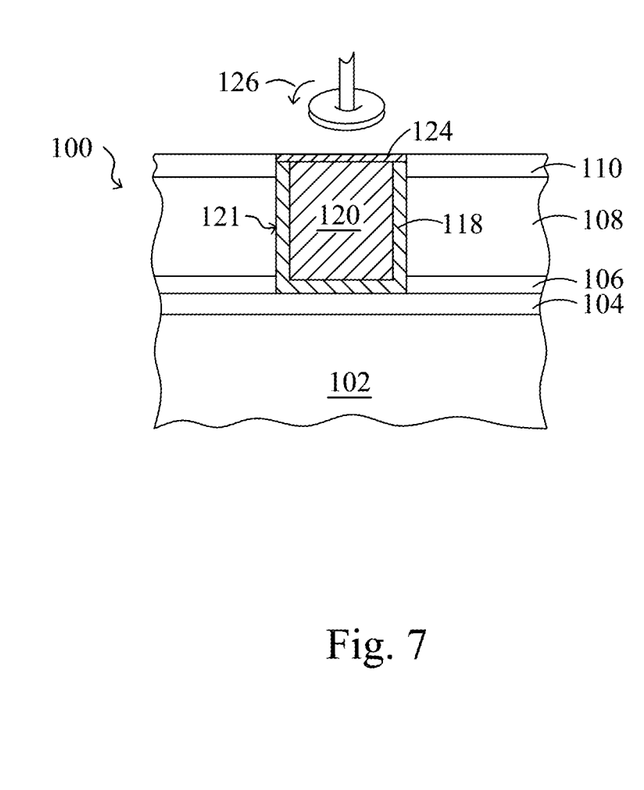

A capping layer 124 comprising Co, Rh, Ir, Fe, Ni, or combinations or multiple layers thereof is formed on the top surface of the conductive feature 121, as shown in FIG. 7. The capping layer 124 may be formed by introducing a cobalt-containing gas such as $CpCo(CO)_2$ and $NH_3$ in a chamber in which the semiconductor device 100 is being processed, so that a capping layer 124 comprising a layer of cobalt forms on exposed surfaces of the conductive material 120 and the liner 118, as shown in FIG. 7. The capping layer 124 does not form on the cap layer 110, due to the material of the cap layer 110, for example. The capping layer 124 may have a thickness of about 1 to 3 nm. Alternatively, the capping layer 124 may be formed using other methods, and the capping layer 124 may comprise other materials and dimensions. The capping layer 124 is formed above the recessed conductive material 120 and liner 118. The capping layer 124 disposed over the conductive material 120 and the liner 118 improves electromigration characteristics of the conductive material 120 and liner 118.

The capping layer 124 may be polished using an optional polishing process 126, also shown in FIG. 7. The cap layer 110 including the SiC-rich or SiCN-rich material protects the underlying second insulating material layer 108 during the polishing process 126, advantageously preventing a top surface of the second insulating material layer 108 from contamination from a material such as cobalt in the capping layer 124 during the polishing of the capping layer 124, in this embodiment. Without the cap layer 110, a top surface of the second insulating material layer 108 may be contaminated by cobalt or other material in the capping layer 124, which can lead to time-dependent dielectric breakdown (TDDB) degradation because the cobalt is conductive, for example.

A top surface of the capping layer 124 is substantially coplanar with the top surface of the cap layer 110 in this embodiment after the polishing process 126. Alternatively, the top surface of the capping layer 124 may be non-coplanar with the cap layer 110, and may comprise a greater height than a top surface of the capping layer 124, as shown in FIGS. 9 and 10, to be described further herein.

Figure 8:
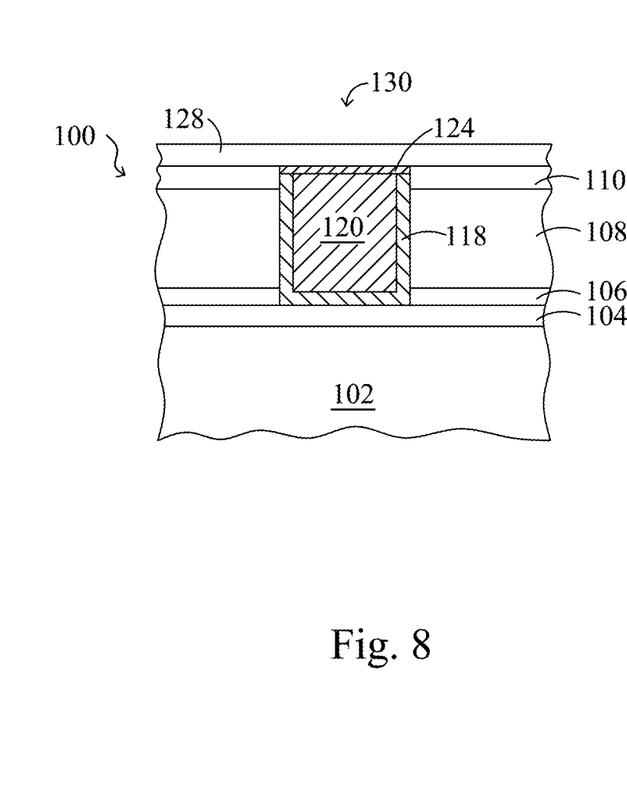

After polishing the capping layer 124, an optional etch stop layer 128 may be formed over the capping layer 124 and the cap layer 110, as shown in FIG. 8. The etch stop layer 128 is also referred to herein as a second etch stop layer 128. The second etch stop layer 128 may comprise similar materials and dimensions and may be formed similar to the methods described for the first etch stop layer 104, for example. The second etch stop layer 128 may comprise an etch stop layer for a subsequently formed material layer, for example, not shown.

The conductive feature 130 formed in the patterned first insulating material layer 106, second insulating material layer 108, and cap layer 110 includes the conductive material 120, the liner 118, and also the capping layer 124 formed at the top surface thereof. The conductive feature 130 may comprise a via, a plug, or a conductive line that extends in and out of the paper, for example, not shown. Advantageously, the protective cap layer 110 protects the underlying second insulating material 108 comprising the low-k dielectric material from cobalt contamination or contamination from another material in the capping layer 124, preventing electromigration problems of the conductive feature 130 in the end product.

Figure 9:
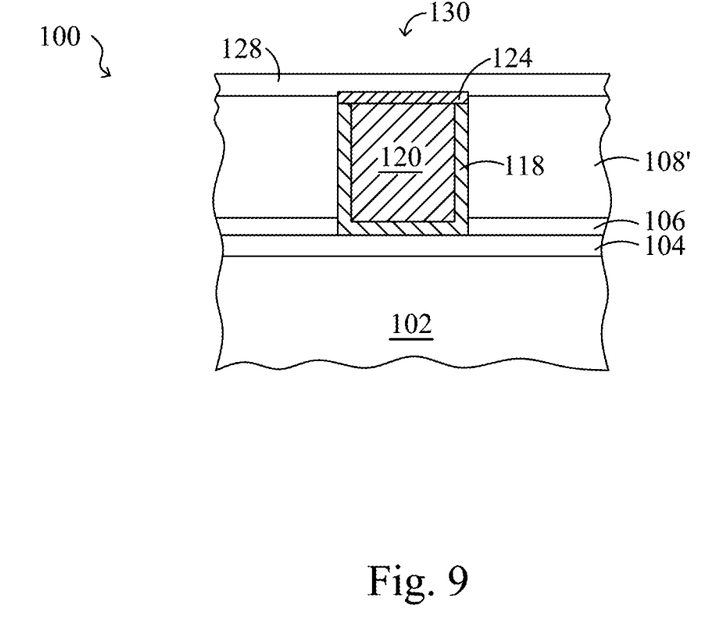
FIG. 9 is a cross-sectional view of another embodiment, wherein an insulating material includes a protective substance formed therein for contamination protection.
Figure 10:
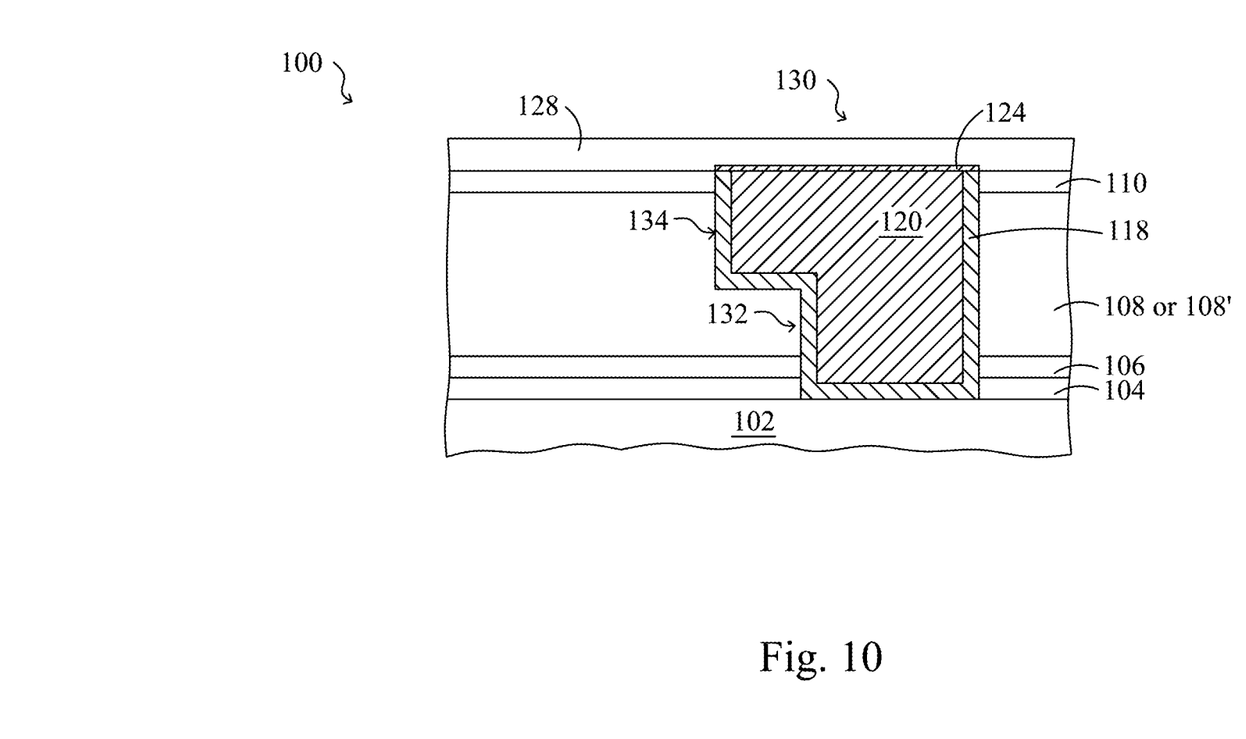
FIG. 10 illustrates a cross-sectional view of an embodiment wherein a conductive feature is formed using a dual damascene process and the structure includes contamination protection for a material layer proximate the conductive feature.

In other embodiments, a cap layer 110 is not included in the structure, and the protective material is included in the second insulating material layer 108' comprising the low-k material, as shown in FIG. 9. A cross-sectional view of an embodiment is shown, wherein a second insulating material layer 108' includes a protective substance formed therein for cobalt contamination protection or protection from contamination by another material in the capping layer 124. The insulating material layer 108' includes a silicon carbide (SiC)-rich material comprising about 13% or greater of carbon (C) in some embodiments. The insulating material layer 108' comprises a low dielectric constant (k) dielectric material layer, the low k dielectric material layer having a k value of less than about a k value of silicon dioxide ($SiO_2$), for example. The low k dielectric material layer comprises a SiC-rich material or a SiCN-rich material comprising about 60% or greater of SiC or SiCN, respectively, in some embodiments. Alternatively, the low k dielectric material may comprise other materials.

The second insulating material layer 108' and the first insulating material layer 106 are patterned with a desired pattern for a conductive feature, as described for the embodiment of FIGS. 1 through 8, and a liner 118 and a conductive material 120 are formed over the second insulating material layer 108'. A CMP process 122 is used to remove the excess liner 118 and conductive material 120 from over the top surface of the second insulating material layer 108 (rather than from over the cap layer 110, which is not included in this embodiment). A capping layer 124 is formed over conductive material 120 and liner 118, forming the conductive feature 130 within the first and second insulating material layers 106 and 108' (and optionally also in at least a portion of the ESL 104, not shown). The capping layer 124 may be thin enough to not require polishing, in this embodiment. A second ESL 128 may optionally be formed over the second insulating material layer 108' and the conductive feature 130, also shown in FIG. 9. The SiC-rich material of the second insulating material layer 108' protects a top surface of the second insulating material layer 108' from contamination from cobalt or another material in the capping layer 124 during the cobalt deposition process, in this embodiment.

In the embodiment shown in FIG. 9, top surfaces of the liner 118 and the conductive material 120 may optionally be slightly recessed below a top surface of the second insulating material layer 108' after the CMP process 122. The top surface of the capping layer 124 may not be coplanar with and may reside above the top surface of the second insulating material layer 108', as shown. Alternatively, the top surfaces of the liner 118 and conductive material 120 may be substantially coplanar with the top surface of the CMP process 122, and/or the top surface of the capping layer 124 may be coplanar with the top surface of the second insulating material layer 108' after the polishing process 126 of the capping layer 124, not shown.

FIG. 10 illustrates a cross-sectional view of an embodiment wherein a conductive feature 130 is formed using a dual damascene process. After the material layers 104, 106, 108 or 108', and/or 110 described herein are formed over the workpiece 102, the material layers 104, 106, 108 or 108', and/or 110 are patterned using two lithography masks, one for vias and another for conductive lines disposed over the vias. The manufacturing process steps previously described herein are performed, forming a conductive feature 130 having a via portion 132 in a lower region and a conductive line portion 134 disposed over the via portion 132. The patterns for the via portion 132 and the conductive line portion 134 are simultaneously filled in the deposition processes for the liner 118 and the conductive material 120, for example. Both the cap layer 110 and the second insulating material layer 108' including the SiC-rich material may optionally be included in the structure, or alternatively, either the cap layer 110 or the second insulating material layer 108' may be included in the structure for protection against contamination from a material of the capping layer 124.

In the embodiment shown in FIG. 10, the etch stop layer 104 has also been patterned with a pattern for a via portion 132 of the conductive feature 130. The etch process 116 (not shown in FIG. 10; see FIG. 3) may be adapted to stop when a chemistry of the etch stop layer 104 is no longer detected or is detected to be reduced during the etch process 116, for example, so that the etch process 116 is discontinued when the etch stop layer 104 has been patterned. Alternatively, a portion of the etch stop layer 104 may be patterned, by detecting when the etch stop layer 104 is reached, after which time the etch process 116 is discontinued. A small top portion of the etch stop layer 104 may be patterned in these embodiments.

FIG. 10 also illustrates an embodiment wherein the top surface of the liner 118 and the conductive material 120 are substantially coplanar with the top surface of the cap layer 110 (or insulating material layer 108', if the cap layer 110 is not included) after the CMP process 122. The top surface of the capping layer 124 is not coplanar with and resides above the top surface of the cap layer 110 (or insulating material layer 108') after the polishing process 126 for the capping layer 124. Alternatively, the top surface of the liner 118 and the conductive material 120 may be recessed below the top surface of the cap layer 110 or insulating material 108', as shown in the previous embodiments, and/or the top surface of the capping layer 124 may be substantially coplanar with the top surface of the cap layer 110 or insulating material 108', not shown.

Figure 11:
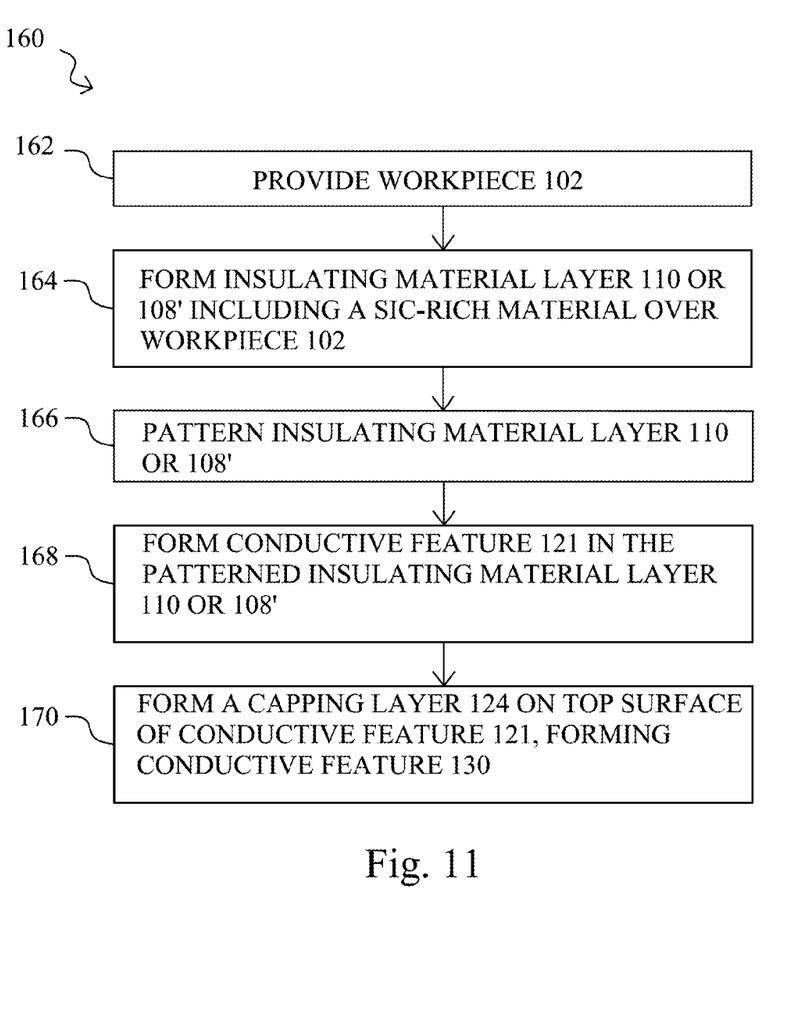
FIG. 11 is a flow chart illustrating a method of forming conductive features of a semiconductor device in accordance with an embodiment.

FIG. 11 is a flow chart 160 illustrating a method of forming conductive features 130 of a semiconductor device 100 in accordance with an embodiment. In step 162, a workpiece 102 is provided. In step 164, an insulating material layer 110 or 108' including a SiC-rich material is formed over the workpiece 102. In step 166, the insulating material layer 110 or 108' is patterned. In step 168, a conductive feature 121 is formed in the patterned insulating material layer 110 or 108'. In step 170, a capping layer 124 is formed on the top surface of the conductive feature 121, forming a conductive feature 130 that includes the capping layer 124.

Figure 12:
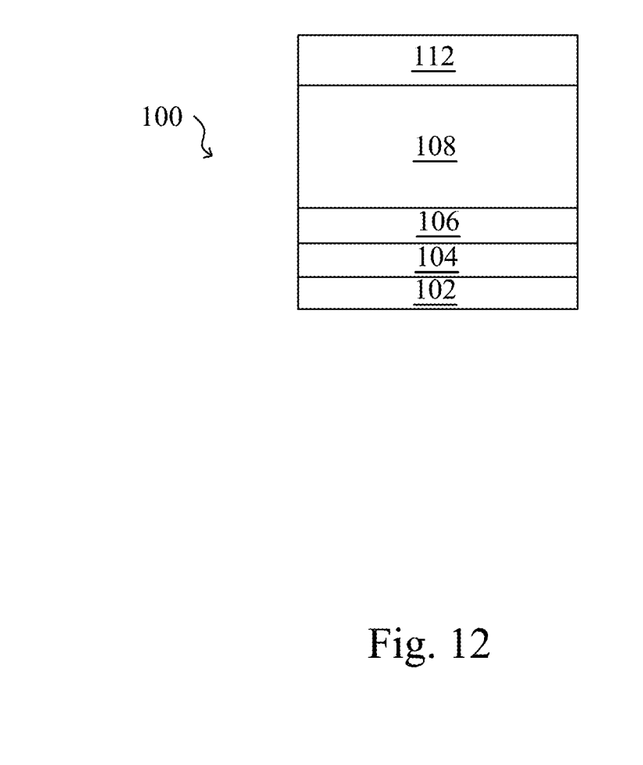
FIG. 12 through 18 illustrate cross-sectional views of a method of forming a conductive feature at various stages of manufacturing in accordance with another embodiment.
Figure 13:
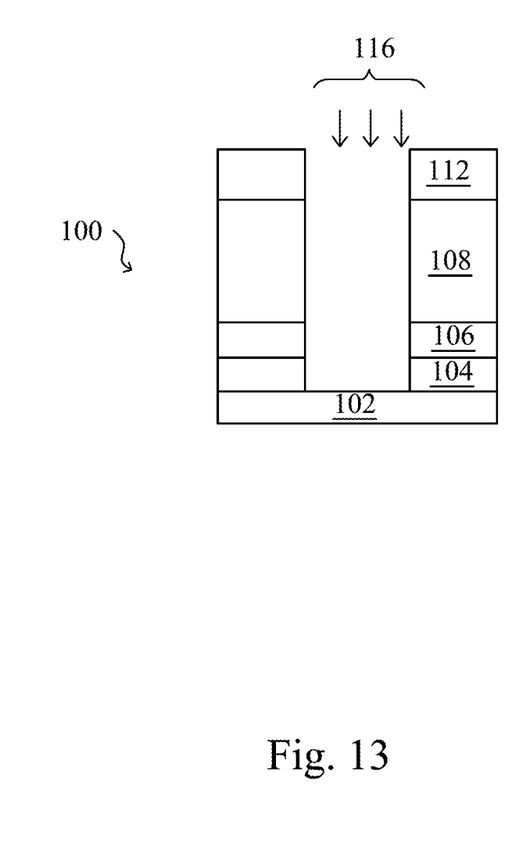

FIG. 12 through 18 illustrate cross-sectional views of a method of forming a conductive feature at various stages of manufacturing in accordance with another embodiment of the present disclosure, wherein the cap layer 110 is formed using a H$_2$/He treatment. The ESL 104 is formed over the workpiece 102, the first insulating material layer 106 is formed over the ESL 104, and the second insulating material layer 108 is formed over the first insulating material layer 106, as shown in FIG. 12. A layer of photoresist 112 is formed over the second insulating material layer 108. The layer of photoresist 112 is patterned and then used as a mask while portions of the second insulating material layer 108, the first insulating material layer 106, and the ESL 104 are etched away using the etch process 116, as shown in FIG. 13.

Figure 14:
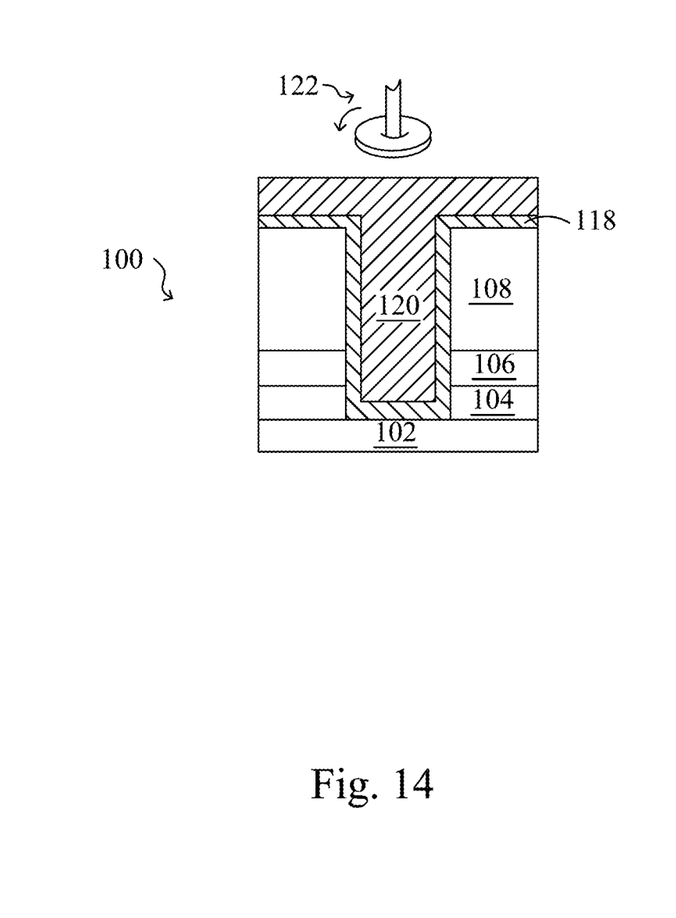

The liner 118 is formed over the patterned material layers 108, 106, and 104, and the conductive material 120 is formed over the liner 118, as shown in FIG. 14. The CMP process 122 is used to remove portions of the conductive material 120 and the liner 118 from over the top surface of the second insulating material layer 108, also shown in FIG. 14, forming the conductive feature 121 and leaving the structure shown in FIG. 15.

Figure 15:
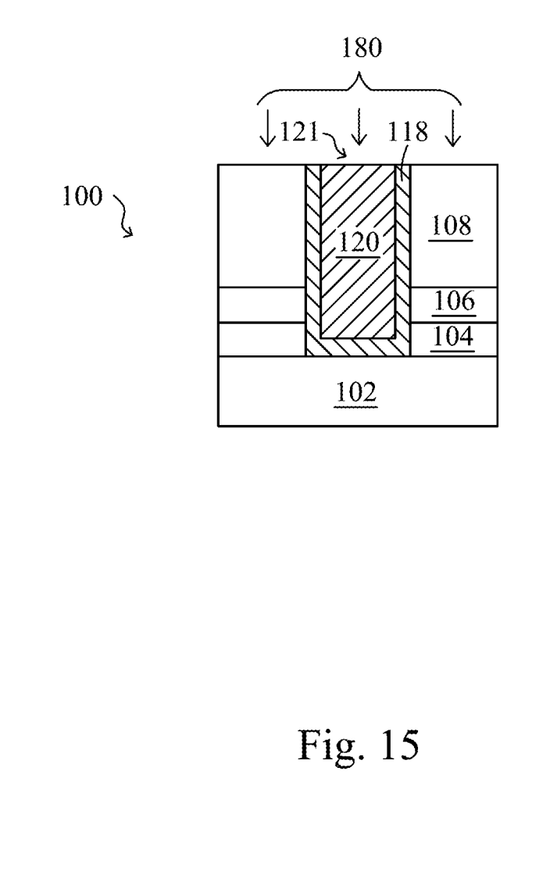
Figure 16:
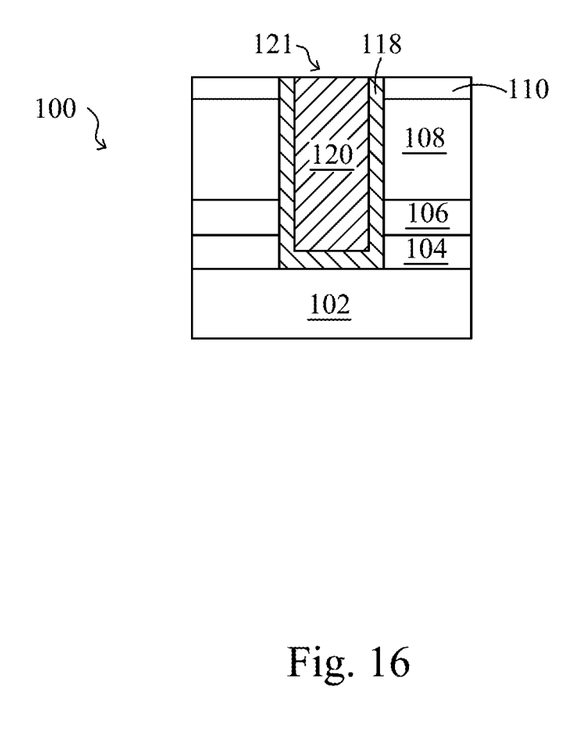

The semiconductor device 100 is exposed to a H$_2$/He treatment 180, also shown in FIG. 15, forming the cap layer 110, as shown in FIG. 16. The H$_2$/He treatment 180 reacts with the top surface of the second insulating material layer 108, forming a cap layer 110 comprising a material such as SiCOH. The cap layer 110 is dense and has less moisture, due to the H$_2$/He treatment 180. The cap layer 110 prevents contamination of insulating material layer 108 by a material such as Co in the capping layer 124, for example.

Figure 17:
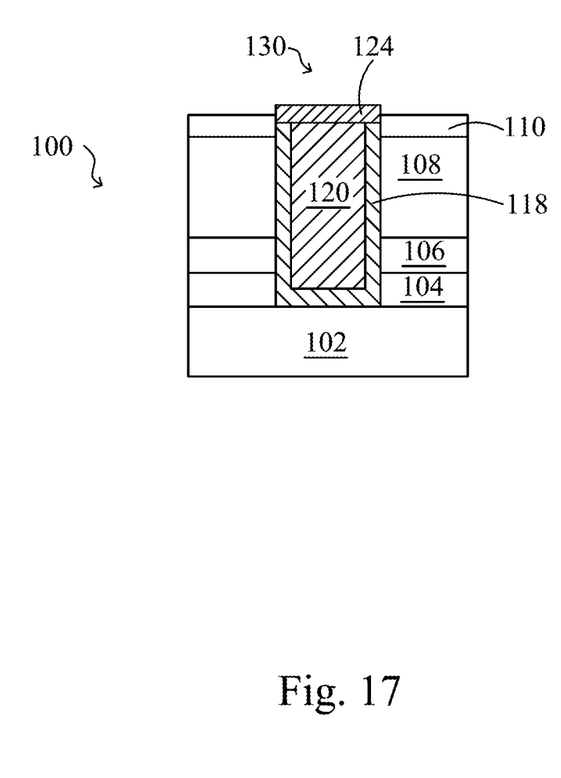
Figure 18:
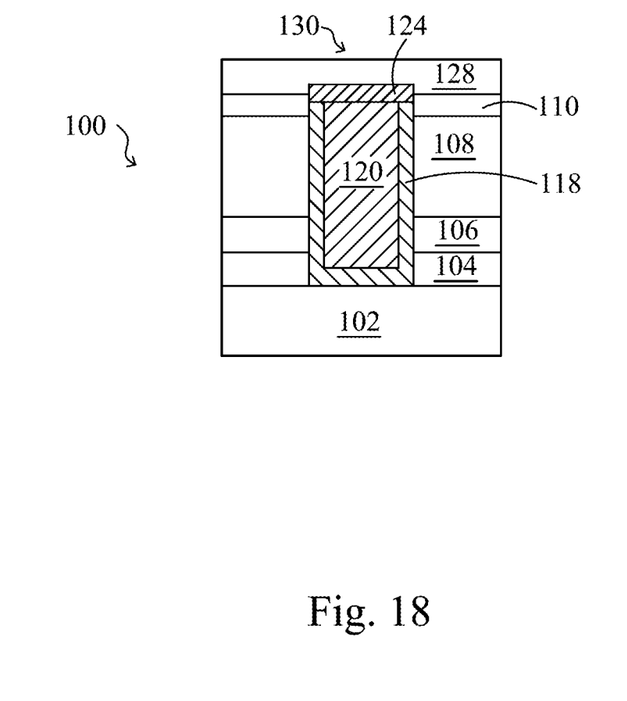

The capping layer 124 is then formed over the top surface of the conductive material 120 and the liner 118, as shown in FIG. 17, and the capping layer 124 may optionally be polished. An ESL 128 may be formed over the top surfaces of the capping layer 124 and the cap layer 110, as shown in FIG. 18. Note that in some of the claims of the present disclosure, the capping layer 124 is also referred to as a second capping layer 124, and the cap layer 110 is also referred to as a first capping layer 110, for example.

Embodiments of the present disclosure include methods of manufacturing semiconductor devices 100 and conductive features, and also include semiconductor devices 100 manufactured using the methods described herein.

Advantages of embodiments of the disclosure include providing novel designs for conductive features 130 and methods of manufacture thereof having improved cobalt capping integrity. The capping layer 124 comprises a cap layer for the conductive features 130 that provides reduced electromigration for the conductive features 130, yet cobalt and other material contamination of underlying low dielectric constant material layers, such as second insulating material layers 108 and 108' is avoided described herein. The SiC-rich material included in the second insulating material layer 108' protects the second insulating material layer 108' from contamination from cobalt or other materials in the capping layer 124 in some embodiments. In other embodiments, the SiC-rich material in the protective cap layer 110 protects an underlying material layer such a second insulating material layer 108 disposed beneath the protective cap layer 110 from contamination from the capping layer 124. SiC-rich material may be included in both a second insulating material layer 108' and a protective cap layer 110, providing additional contamination protection, in some embodiments.

TDDB results are improved for the novel semiconductor devices 130, due to the prevention of cobalt and other material contamination on sensitive low k insulating material layers 108 and 108'. The high carbon content of the protective cap layer 110 and/or the second insulating material layer 108' also results in improved breakdown voltage (VBD) results. Test results have revealed that a Co contamination reduction of greater than about 90% is achievable by implementing embodiments of the present disclosure, as one example. The novel semiconductor devices 100 and manufacturing methods are easily implementable in manufacturing process flows.

In accordance with one embodiment of the present disclosure, a semiconductor device includes an insulating material layer disposed over a workpiece. The insulating material layer includes a silicon-containing material comprising about 13% or greater of carbon (C). A conductive feature is disposed within the insulating material layer. The conductive feature includes a capping layer disposed on a top surface thereof.

In accordance with another embodiment, a method of manufacturing a semiconductor device includes forming an insulating material layer over a workpiece, the insulating material layer comprising an SiC-rich material comprising about 13% or greater of carbon. The method includes patterning the insulating material layer, and forming a conductive feature in the patterned insulating material layer. A capping layer formed on a top surface of the conductive feature. The capping layer comprises a material selected from the group consisting essentially of Co, Rh, Ir, Fe, Ni, and combinations thereof.

In accordance with yet another embodiment, a method of forming a conductive feature of a semiconductor device includes providing a workpiece, forming an etch stop layer over the workpiece, forming first insulating material layer over the etch stop layer, and forming a second insulating material layer over the first insulating material layer. The second insulating material layer includes a SiC-rich material comprising about 13% or greater of carbon. The method includes patterning the first insulating material layer and the second insulating material layer with a pattern for a conductive feature, forming a liner over the patterned first insulating material layer and the second insulating material layer, and forming a conductive material over the liner. A CMP process is performed, removing the conductive material and the liner from over a top surface of the second insulating material layer and forming a conductive feature that includes the conductive material and the liner left remaining in the patterned first insulating material layer and the second insulating material layer. A capping layer is formed on a top surface of the conductive feature. The capping layer comprises a material selected from the group consisting essentially of Co, Rh, Ir, Fe, Ni, and combinations thereof.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    forming an insulating material layer over a workpiece, the insulating material layer comprising a silicon carbide (SiC)-rich material comprising about 13% or greater of carbon (C);
    patterning the insulating material layer;
    forming a conductive feature in the insulating material layer; and
    forming a capping layer on a top surface of the conductive feature, wherein forming the capping layer comprises forming a material selected from the group consisting essentially of Co, Rh, Ir, Fe, Ni, and combinations thereof, at least a portion of the capping layer extending below a top surface of the insulating material layer.

2. The method according to claim 1, wherein forming the conductive feature comprises forming a conductive material over the patterned insulating material layer and using a chemical-mechanical polishing (CMP) process to remove excess portions of the conductive material from over top surfaces of the patterned insulating material layer, leaving the conductive feature in the patterned insulating material layer.

3. The method according to claim 2, wherein forming the conductive feature comprises a single damascene process or a dual damascene process.

4. The method according to claim 3, wherein forming the conductive feature comprises forming a conductive feature having a via portion and a conductive line portion disposed over the via portion.

5. The method according to claim 1, wherein the SiC-rich material protects the insulating material layer from contamination from a material in the capping layer, or wherein the SiC-rich material protects a material layer disposed beneath the insulating material layer from contamination from the capping layer.

6. The method according to claim 1, wherein forming the capping layer comprises forming a second capping layer, further comprising forming a first capping layer over the insulating material layer using a $H_2$/He treatment, before forming the second capping layer.

7. The method according to claim 1, wherein the step of patterning the insulating material layer occurs before the step of forming a conductive feature in the insulating material layer.

8. A method of forming a conductive feature of a semiconductor device, the method comprising:
    forming a first etch stop layer over a workpiece;
    forming a first insulating material layer over the first etch stop layer;
    forming a second insulating material layer over the first insulating material layer, the second insulating material layer comprising a silicon carbide (SiC)-rich material comprising about 13% or greater of carbon (C);
    patterning the first insulating material layer and the second insulating material layer with a pattern for a conductive feature;
    forming a liner over the patterned first insulating material layer and the second insulating material layer;
    forming a conductive material over the liner;
    performing a chemical mechanical polish (CMP) process, removing the conductive material and the liner from over a top surface of the second insulating material layer and forming a conductive feature, the conductive feature comprising the conductive material and the liner left remaining in the patterned first insulating material layer and the second insulating material layer; and
    forming a capping layer on a top surface of the conductive feature, wherein forming the capping layer comprises forming a material selected from the group consisting essentially of Co, Rh, Ir, Fe, Ni, and combinations thereof, the capping layer having a top surface substantially coplanar with a top surface of the second insulating material layer.

9. The method according to claim 8, wherein forming the capping layer comprises forming a capping layer having a thickness of about 1 to 3 nm.

10. The method according to claim 8, further comprising polishing the capping layer on the top surface of the conductive feature.

11. The method according to claim 8, wherein forming the liner comprises forming a layer having a thickness of about 1.0 to 4.5 nm, or wherein forming the liner comprises forming a material selected from the group consisting essentially of TiN, TaN, and combinations thereof.

12. The method according to claim 8, wherein forming the second insulating material layer comprises forming the SiC-rich material in an amine ($NH_3$) environment.

13. The method according to claim 8, wherein the step of wherein forming the second insulating material layer occurs before the step of forming a conductive material over the liner.

14. A method of manufacturing a semiconductor device, the method comprising:
    forming an etch stop layer over a substrate;
    forming an insulating layer over the etch stop layer, the insulating layer including a low dielectric constant material;
    forming a cap layer comprising a silicon carbonitride (SiCN)-rich material comprising a total carbon and nitrogen percentage greater than 50% over the insulating layer;
    patterning the insulating layer to form an opening therein;
    forming a liner in the opening;
    forming a conductive feature on the liner; and
    forming a capping layer on a top surface of the conductive feature, wherein forming the capping layer comprises forming a material selected from the group consisting essentially of Co, Rh, Ir, Fe, Ni, and combinations thereof, at least a portion of the capping layer extending below a top surface of the cap layer.

15. The method according to claim 14, further comprising patterning the cap layer to form the opening therein as well as in the insulating layer.

16. The method according to claim 14, further comprising:
subjecting the insulating layer to a $H_2$/He treatment to form the cap layer.

17. The method according to claim 14, further comprising:
polishing the capping layer on the top surface of the conductive feature.

18. The method of claim 14, wherein a top surface of the capping layer extends above a topmost top surface of the cap layer.

19. The method of claim 14, wherein the forming the cap layer further comprises:
forming a SiC-rich material in an amine ($NH_3$) environment to form the SiCN-rich material.

* * * * *